United States Patent
Chua-Eoan et al.

(10) Patent No.: US 7,246,287 B1
(45) Date of Patent: Jul. 17, 2007

(54) FULL SCAN SOLUTION FOR LATCHED-BASED DESIGN

(75) Inventors: Lew Chua-Eoan, San Jose, CA (US); Era Kasturia Nangia, Los Altos, CA (US)

(73) Assignee: MIPS Technologies, Inc., Mountain View, CA (US)

( * ) Notice: Subject to any disclaimer, the term of this patent is extended or adjusted under 35 U.S.C. 154(b) by 834 days.

(21) Appl. No.: 10/255,107

(22) Filed: Sep. 26, 2002

Related U.S. Application Data

(63) Continuation-in-part of application No. 10/115,289, filed on Apr. 4, 2002, now abandoned.

(51) Int. Cl.
*G01R 31/28* (2006.01)

(52) U.S. Cl. .................. 714/733; 714/726; 714/724

(58) Field of Classification Search ............. 714/733, 714/726, 731, 724
See application file for complete search history.

(56) References Cited

U.S. PATENT DOCUMENTS

| | | | |
|---|---|---|---|
| 5,592,493 | A | 1/1997 | Crouch et al. |
| 5,748,646 | A | 5/1998 | Hosokawa |
| 5,889,788 | A | 3/1999 | Pressly et al. |
| 6,148,425 | A | 11/2000 | Bhawmik et al. |
| 6,289,477 | B1 | 9/2001 | Gunadisastra |
| 6,393,592 | B1 | 5/2002 | Peeters et al. |
| 6,480,980 | B2 | 11/2002 | Koe |
| 6,622,273 | B1 * | 9/2003 | Barnes ................. 714/733 |
| 6,785,855 | B2 * | 8/2004 | Zhang et al. ............ 714/731 |
| 7,031,864 | B2 * | 4/2006 | Matsui ................. 702/117 |
| 7,038,494 | B2 * | 5/2006 | Morton ................. 326/93 |

OTHER PUBLICATIONS

Kamran Zarrineh et al., *System-on-Chip Testability Using LSSD Scan Structures*, pp. 83-97, May-Jun. 2001, IEEE Design and Test of Computers.
Miron Abramovici et al., *Digital Systems Testing and Testable Design*, pp. 364-395, 1997, Jaico Publishing House.
Vivek Chickermane et al., *Automated Chip-Level I/O and Test Insertion Using IBM Design-For-Test Synthesis*, pp. 21-24, vol. 6, No. 2 May 2000, IBM MicroNews.
Edward B. Eichelberger, et al., "Structured Logic Testing,"*Prentice Hall*, Englewood Cliffs, New Jersey, 1991, Table of Contents.
Janusz Rajski, et al., "BIST for System-on-chip," *Mentor Graphics*, Built-in Self-test Technology Seminar, Dec. 1998, (pp. 1/10, 2/15, 3/14, 4/15, 5/10, 6/16, 7/16, 8/14, 9/13, 10/10).

(Continued)

*Primary Examiner*—Phung My Chung
(74) *Attorney, Agent, or Firm*—Cooley Godward Kronish LLP

(57) ABSTRACT

A full-scan latch is provided that may be used to incorporate design for test functionality in an integrated circuit. The full-scan latch includes a shadow latch, a multiplexer, and a slave latch. The full-scan latch has a test mode and a normal mode. When in the normal mode, the device operates as a transparent latch, passing a data input to its output. When in test mode, the device is operable to pass scan data down a scan chain and to inject scan data into the data path.

20 Claims, 10 Drawing Sheets

OTHER PUBLICATIONS

Alfred L. Crouch, "Design-for-test for Digital IC's and Embedded Core Systems," *Prentic Hall PTR*, Upper Saddle River, NJ, 1999, Table of Contents.

Carol Pyron, et al., "DFT Advances in Motorola's MPC7400, a Power PC™ Microprocessor," *Motorola, Inc.*, Austin Texas, Published by International Test Conferences, 1999, pp. 137 to 146.

Manson Shashaani, et al., "A DFT Technique for High Performance Circuit Testing," University of Waterloo, Ontario, Canada, Published by International Test Conference, 1999, pp. 276 to 285.

J. Turnino, D&T, "Design for Testability," Microprocessor Verification, Test, and Design, ECE 371EMR, Lecture 22, 1999, 9 pages, [online document], retrieved from the Internet: URL: http://www.crhc.uiuc.edu/ECE371EMR/lectures/lec22_4.

Mikael Olausson & Daniel Wiklund, "Introduction to Design for Testability," Electronic Devices, IFM, Linkopings Universitet, DEc. 13, 2000, [online document], retrieved from the internet: URL: http://www.ida.liu.se/~zebpe/teaching/test/lec6.pdf.

Department of Electronics, Carleton University, John Knight, "Scan Tests," [online document] printed: Nov. 16, 2001, modified: Nov. 16, 2001, 13 pages, [online document], retrieved from the Internet: URL: http://web.doe.carleton.ca/~achar/.

* cited by examiner

FULL SCAN SOLUTION FOR LATCHED-BASED DESIGN

CROSS-REFERENCE TO RELATED APPLICATIONS

This application is a continuation-in-part of U.S. application Ser. No. 10/115,289, filed Apr. 4, 2002. The disclosure of the prior application is considered part of and is incorporated by reference in the disclosure of this application.

TECHNICAL FIELD

This description is directed to an integrated circuit design-for-test (DFT) technique, and more particularly, to an improved scan scheme.

BACKGROUND

As the density of very large scale integration (VLSI) circuits increases, the testability of those circuits decreases. When testing the design of a VLSI chip, it is possible to trace signals through each circuit module and verify the correct behavior at each step. However, testing for manufacturing defects in this manner would be impractical, as it would require dedicating a large number of pins solely for test purposes at a great cost.

Today, application specific integrated circuits (ASIC) often include millions of gates in a system-on-chip (SoC) configuration with embedded processor cores (often supplied by a third party), memory, and application-specific logic. Testing such circuits is a daunting task, as shown by the quantity of research in design-for-test (DFT) techniques and built-in self-test (BIST) functionality.

One common technique for testing a simple circuit, such as an AND gate, is to apply a series of input vectors and observe the output of the circuit to verify the appropriate behavior. For example, an AND gate includes two inputs, A and B, and an output C. The output C should be the logical AND of the inputs A and B. A series of test vectors, $[(A_1,B_1),C_1], [(A_2,B_2),C_2], \ldots [(A_n,B_n),C_n]$, may be used to verify the operation of the AND gate. For example, the first vector may be [(0,0),0], i.e., a "0" is applied to each of A and B, and the expected output is "0". Similarly, for the test vector [(1,1),1], a "1" is applied to each of A and B and the expected output of the AND gate is "1." If the expected output is not observed, then the circuit is defective. As circuit complexity increases, the same basic technique can be applied by making components of the circuit observable and controllable so that the inputs to a circuit or a component of a complex integrated circuit may be controlled and the corresponding output observed.

One technique used to make integrated circuits both controllable and observable is to incorporate scan registers into the circuit design. For example, Huffman illustrated that sequential logic circuits may be modeled as combinatorial logic in conjunction with a register (e.g., latch, flip-flop) to store state. The register includes an input from the combinatorial logic so that the state may be changed, an output to the combinatorial logic so that the state may be used by the logic, and a clock signal. The register may be modified to a scan register to implement scan-based DFT. The scan register additionally includes a mode signal to switch the scan register between a normal mode and a test mode; an input signal to receive a test vector to be used by the combinational logic circuit; and an output signal so that test results may be observed.

To reduce the number of pins needed in an integrated circuit employing scan-based DFT, a series of scan registers may be connected in a chain such that scan inputs and outputs may be serially shifted through the chain to reduce the number of pins needed to fully test the integrated circuit.

SUMMARY

In one general aspect, a full-scan latch includes a shadow latch, a multiplexer, and a slave latch. The shadow latch receives a scan input signal and passes the signal to the multiplexer. The multiplexer receives a data input signal the scan input signal from the shadow latch, and produces an output signal selected from the two input signals based on a scan control signal. The slave latch receives the multiplexer output and produces a data output and a scan output signal. The full-scan latch includes a first mode for testing and a second mode for normal operation, with the selected mode being indicated by the scan control signal.

In some implementations, the full-scan latch includes a clock buffer that receives a clock input signal and generates a buffered clock signal that is used to control the shadow latch and the slave latch. The behavior of the clock buffer may be varied using the scan control signal. The shadow latch and the slave latch are transparent on different phases of the buffered clock signal. The shadow latch may be implemented using a phi1-sensitive latch or a phi2-sensitive latch.

In another general aspect, a system enabling full scan functionality in integrated circuits is provided. The system includes an integrated circuit and a testing device coupled to the integrated circuit. The integrated circuits include at least one logic block and a scan chain with a full-scan latch. The full-scan latch may be used with both combinational and dynamic logic circuits and includes a shadow latch, a multiplexer, and a slave latch.

The shadow latch includes an input that receives a scan input signal through the scan chain, and an output coupled to the multiplexer with a first input coupled to a data path of the integrated circuit, a second input coupled to the output of the shadow latch, and a control signal input. The output of the multiplexer is coupled to the slave latch. The multiplexer receives a control signal through the control signal input and selects a signal received from the first input or a signal received from the second input and pass the selected signal to the output. The integrated circuit includes a first mode for testing and a second mode for normal operation.

In some implementations, the full-scan latch further includes a clock buffer that receives a clock input signal and outputs a buffered clock signal used to operate the shadow latch and the slave latch. The shadow latch and the slave latch are transparent on different phases of the buffered clock signal and the slave latch may be phi 1-senstive or phi2-senstive.

In another general aspect, a method is provided to incorporate design-for-test functionality in an integrated circuit by inserting a scan cell between a first logic block and a second logic block. The method includes inserting a master latch between the first logic block and the second logic block, a shadow latch coupled to a scan chain, a multiplexer, and a slave latch coupled to the multiplexer and the scan chain. The shadow latch receives a scan chain signal from the scan chain. The multiplexer receives a data signal from the second logic block and a scan chain signal from the shadow latch and selects the data signal or the scan chain signal. The selected signal is used to produce a multiplexer output signal that is sent to the slave latch.

The slave latch is operable to capture the data signal from the second logic block or the scan chain signal from the shadow latch and to pass the captured signal through the scan chain.

Additionally, techniques herein described may be implemented as a computer-readable medium including an integrated circuit embodied in software. The details of one or more implementations are set forth in the accompanying drawings and the description below. Other features and advantages will be apparent from the description and drawings, and from the claims.

DETAILED DESCRIPTION

Maximum fault coverage in a latched-based microprocessor unit (MPU) is often hard to achieve due to complexities resulting from sequential scan depth; gated clock buffers and the resulting non-testability of subsequent cones of logic; and clocking issues around dynamic precharge of devices. There are two primary scan-based schemes typically used in MPUs: (1) level sensitive scan design (LSSD), typically using four generated clocks for functional and scan mode; and (2) mux-based scan mainly used by a variety of ASIC vendors. In its general form, mux-based scan is register-based in nature and typically adheres more easily to register-based designs. Conventional mux-based scan schemes provide full-scan capabilities with only minor increases in circuit sizes (typically 10–20%). However, mux-based scan schemes typically do not perform as well as LSSD scan schemes. LSSD does not come without cost, in that significant area is generally required to implement the level-sensitive latches. Additionally, LSSD scan schemes are typically more difficult to incorporate in register-based designs such as MPUs.

It is desirable to provide a mux-based full scan design that provides speed and performance comparable to LSSD scan schemes using as little area as possible. In a full scan design, all sequential registers in a circuit are scanned to ensure maximum testability.

Figure 1A:
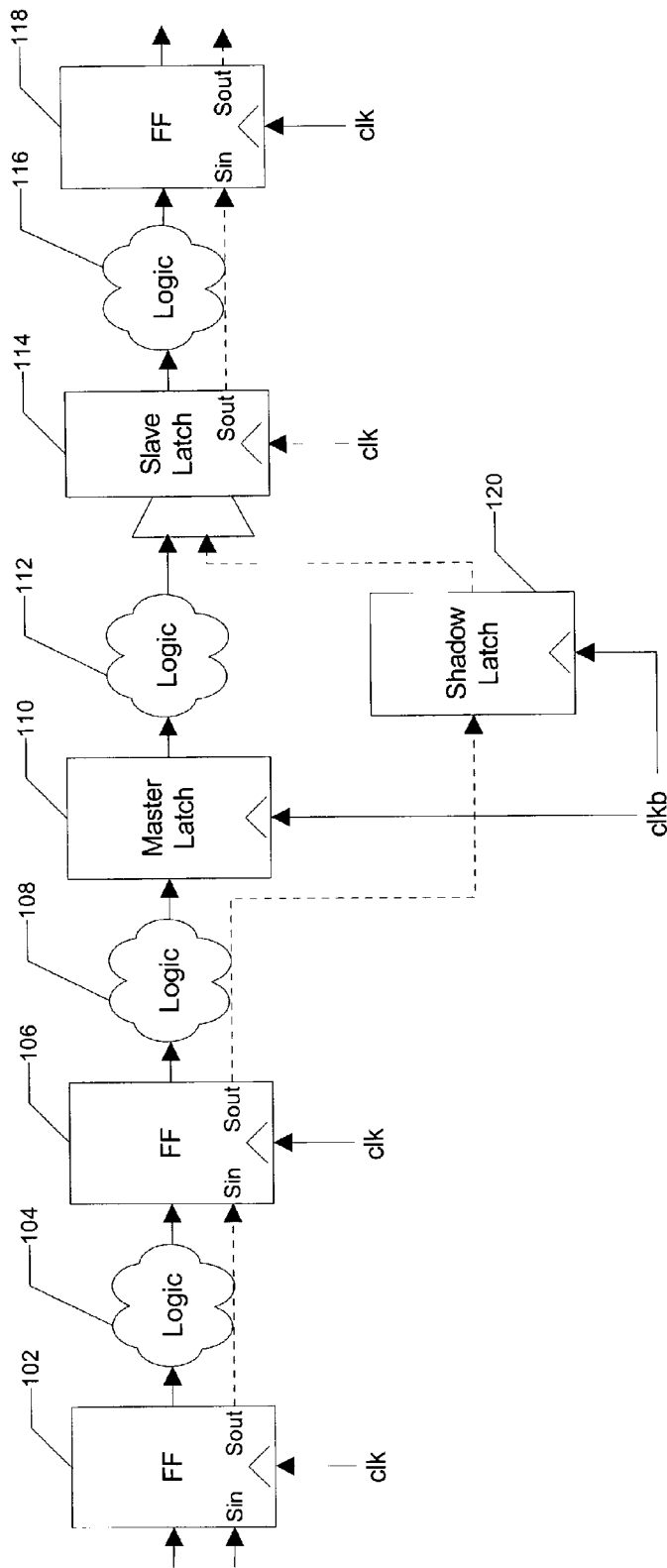
FIG. 1A is a schematic diagram of a circuit incorporating a full-scan scheme in a latch-based design.

FIG. 1A illustrates a mux-based full scan scheme that may be used in latch-based designs. The scheme minimizes the difficulties with fault grading a design though the stipulation of strict cycle-by-cycle scan by using a shadow latch in tandem with a slave latch. The mux-based full scan scheme also may be used to scan conditional ports of gated clock buffers, and static and dynamic logic in a mixed fashion in both full scan and functional modes.

As shown in FIG. 1A, an integrated circuit incorporating a mux-based full scan design includes a series of flip-flips, combinatorial logic, and groups of master, slave, and shadow latches as will be discussed in detail below. This design enables testing of the integrated circuit by observing and/or controlling each sequential step in the circuit. In normal operation, data is input into flip-flop 102 and is successively passed through combinatorial logic 104, flip-flop 106, combinatorial logic 108, master latch 110, combinatorial logic 112, slave latch 114, combinatorial logic 116, and flip-flop 118. When in test mode, shadow latch 120 may also be used. Each of flip-flops 102, 106, and 118 are multiplexing flip-flops typical of mux-based scan schemes.

Instead of a flip-flop, a combination of a master latch 110, slave latch 114, and shadow latch 120 may be used to create a scan cell within a chain. For example, in FIG. 1A, master latch 110 and shadow latch 120 are coupled to clock signal clkb. Each is a transparent latch that allows input signals to pass while clkb is high and latches the output value when clkb falls to low. Thus, master latch 110 receives the output from logic block 108, allows the output from logic block 108 to pass to logic block 112 while clkb is high, and when clkb falls low, holds the output of logic block 108 until clkb goes high again. Similarly, shadow latch 120 receives the scan output signal from flip-flop 106 allows the scan output signal from flip-flop 106 to pass to the input mux of slave latch 114 while clkb is high, and, when clkb falls low, latches and holds the scan output signal from flip-flop 106. Slave latch 114 receives its input from either shadow latch 120 or logic block 112 based on the control signal to the mux associated with or integrated into slave latch 114.

When the latch group is operating in normal mode, the latches are always transparent and allows signals to pass with only a minor delay as a result of the gates of the master latch 110 and the slave latch 114 in the data path. Thus, this configuration increases the observability and testability of logic without substantially slowing down the circuits operation by introducing an extra flip-flop in a critical path. Additionally, during testing, the circuit can operate at normal speed as the transparent latches allows signals to propagate.

Typically, clkb is a buffered clock signal generated from clock signal clk. This creates a small delay that allows signals to propagate through logic blocks, while preventing degradation of the signal quality of the clock due to analog effects such as fan-out.

Figure 1B:
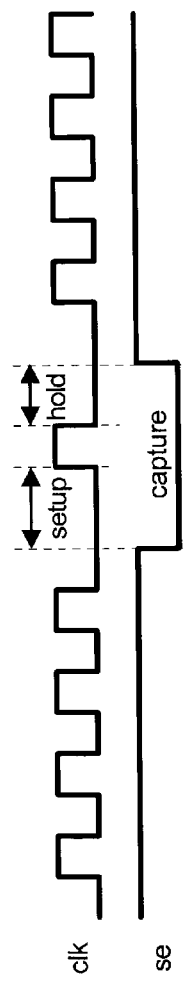
FIG. 1B is a timing diagram for the circuit of FIG. 1A.

FIG. 1B provides a timing diagram that illustrates operation of the circuit of FIG. 1A. In accordance with convention, high and low signals are referred to as phi1 and phi2, respectively. When these terms appear on a functional element in a block diagram, it means the element is active high (if phi1 appears) or active low (if phi2 appears). The circuit functions normally when the scan enable signal (identified as "se") is not asserted. In this implementation, the se signal is asserted low. Accordingly, the circuit enters capture mode when, for example, the se signal is lowered to zero volts (i.e., phi2). To function properly, the latches need a setup time before the rising edge of the clock and a hold time after the rising edge of the clock to properly latch values and propagate scan signals.

Figure 2:
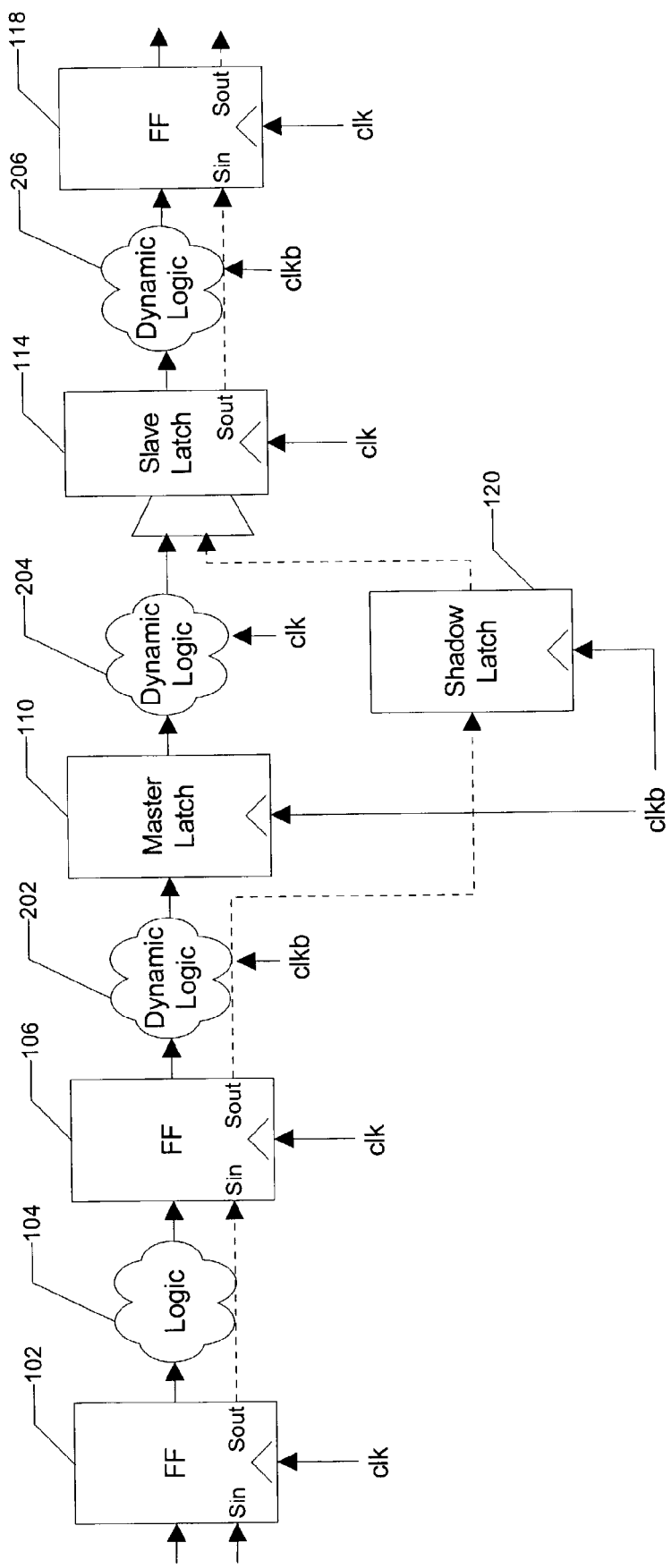
FIG. 2 is a schematic diagram of a dynamic logic circuit incorporating a full-scan scheme in a latch-based design.

Referring to FIG. 2, the same techniques discussed above with reference to FIG. 1A may also be applied to dynamic circuits with only slight modification. The circuit shown in FIG. 2 is similar to that shown in FIG. 1A with the exception that logic blocks 108, 112, and 116 have been replaced with dynamic logic blocks 202, 204, and 206. As long as design rules are followed, dynamic logic may be made observable using groups of latches as discussed above, in addition to using clock signal clkb for dynamic logic 202 and dynamic logic 206, while using clock signal clk for dynamic logic 204. Because clock signal clkb is typically a buffered clk signal, the buffering delay allows sufficient time for dynamic logic 202 to precharge and compute the appropriate result.

The use of a shadow latch as discussed above with reference to FIG. 1A allows full or near-full test coverage and test-at-speed functionality. Mux-based scan schemes have become the de facto standard and are used by multiple manufacturers, with LSSD being the minority alternative. The shadow latch implementation increases portability and eases technology integration, while providing the speed and test coverage of an LSSD system with only a small decrease in usable cycle time.

Figure 3A:
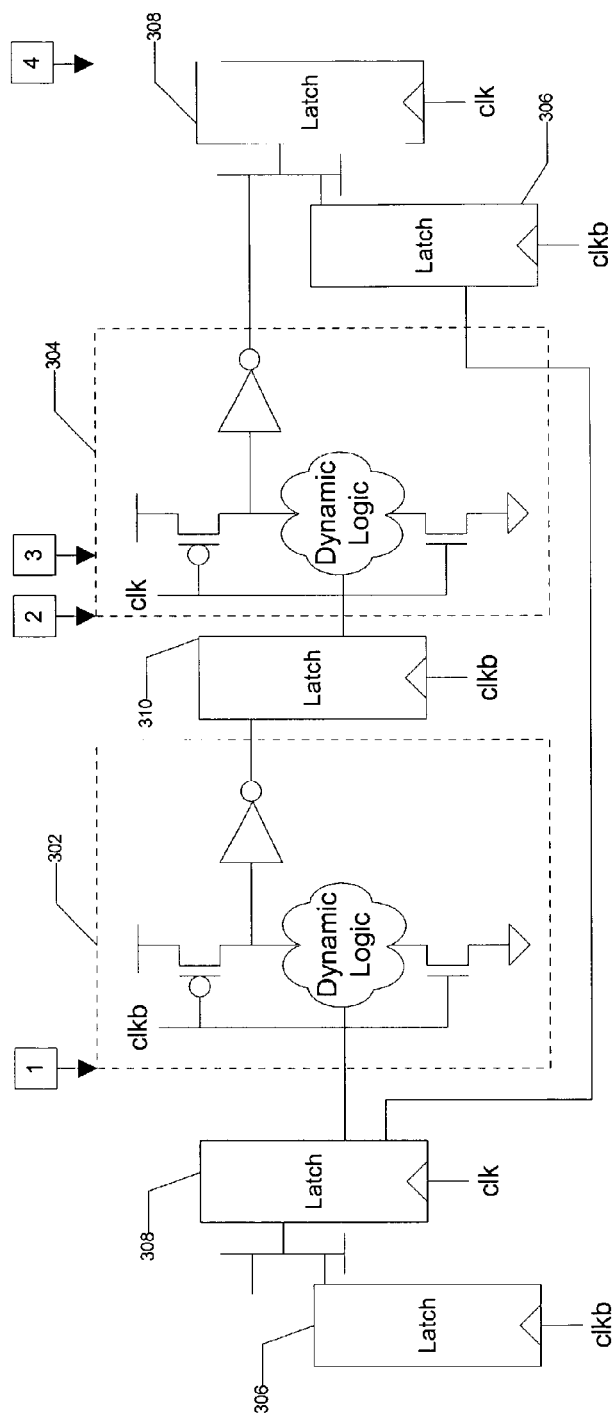
FIG. 3A is a schematic diagram showing the use of a shadow latch in a dynamic logic circuit to provide full-scan capabilities.

Referring to FIG. 3A, a mux-based scan scheme may be incorporated into a dynamic logic circuit so that the values between two dynamic logic blocks 302 and 304 may be observed. In this example, dynamic logic block 302 is preceded by a shadow latch 306 and a slave latch 308. Alternatively, as shown in previous examples, a flip-flop or other scan cell device may be used. A master latch 310 is placed between dynamic logic blocks 302 and 304, to pass the output signal of block 302 to the input of block 304 when clock signal clkb is asserted, and to hold the input value when clkb is deasserted.

Figure 3B:
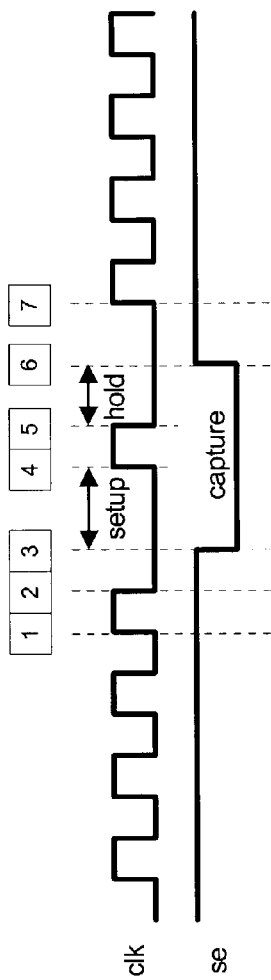
FIG. 3B is a timing diagram of a dynamic logic circuit, such as that shown in FIG. 3A, incorporating full-scan in a latch-based design.

Referring also to FIG. 3B, the signal path may be traced through the circuit shown in FIG. 3A starting at block 1. After some delay clock signal clkb is asserted, the signal at block 1 propagates through dynamic logic block 302. While clock signal clkb is asserted, master latch 310 is transparent and allows the signal to pass from dynamic logic 302 to dynamic logic 304. Dynamic logic 304 is coupled to clock signal clk, precharges when clk is low, and operates when clk is high. Similarly, dynamic circuit 304 includes pull-down logic that precharges when clk is low and evaluates when clk goes high. Thus, the signal at block 3 propagates to block 4 through slave latch 308, which is transparent when clk transitions to high.

The mux-based full scan scheme uses a single clock for functional and scan mode and easily integrates components, such as custom MPUs, with other system-on-chip ("SoC") scan surroundings (typically, mux-scan registered designs). All of these properties help to give maximal coverage.

The techniques discussed above may be integrated in a set of design-for-test (DFT) rules so that circuits designed using these rules incorporate the mux-based full scan scheme as described. In this implementation, the DFT rules require that all memories, including both read-only memory (ROM) and random-access memory (RAM), of whatever nature must be testable using structural techniques. Large memories, such as caches, should include built-in-self-test (BIST) functionality. Smaller memories should be tested using a dedicated scan collar and should be Mentor modeled. These design rules, as discussed further below, implement a mux-based mixed-mode scan scheme to easily integrate with third-party vendors while incurring only a small timing penalty due to an extra mux in the signal path. Additionally, the mixed-mode scan scheme is implemented with fewer transistors than an LSSD implementation while negating the effects of a decoupled scan typical of a pure mux-based implementation.

Referring to FIGS. 4A–4D, a mux-based scan scheme may be implemented using a set of sequential cells including various latches and registers as will be described below. These cells may be incorporated into an integrated circuit design to facilitate testing.

Figure 4A:
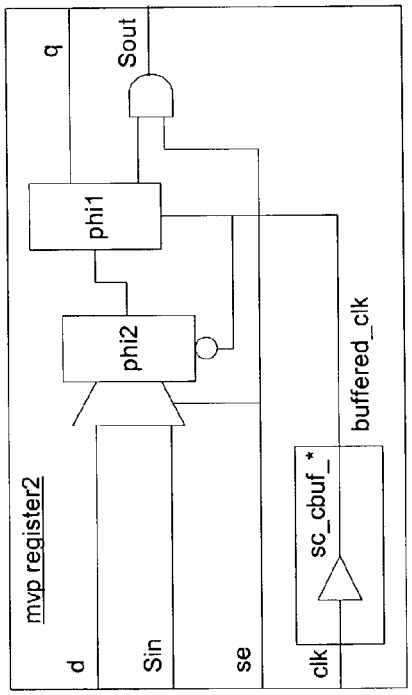
FIG. 4A is a block diagram of a latch cell that may be used to incorporate design-for-test capability in an integrated circuit.

Referring to FIG. 4A, mvp_latch2 includes a conventional latch sc_lat2_* that receives a data input d and outputs a data value q. When a clock signal is asserted low, latch sc_lat2_* is transparent and allows the signal d to pass to output q. When the clock signal is deasserted, the output q is latched until the next clock transition. The mvp_latch2 cell also includes a clock buffer sc_cbuf_* that receives a clock input and outputs a buffered clock signal buffered_clk for use as an input to latch sc_lat2_*.

Figure 4B:
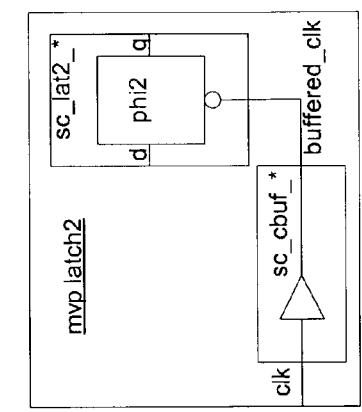
FIG. 4B is a block diagram of a register that may be used to incorporate design-for-test capability in an integrated circuit.

Referring to FIG. 4B, register mvp_register2 is an edge-triggered flip-flop defined by a pair of latches that are active on opposite clock phases. The register mvp_register2 also includes a clock buffer sc_cbuf_* as used in latch mvp_latch2. Register mvp_register2 includes four input signals: a data signal d, a scan input signal $S_{in}$, a scan enable signal se, and a clock signal clk. The data signal d and the scan input signal $S_{in}$ may be loaded into the flip-flop as determined by a mux controlled by the scan enable signal se. Register mvp_register2 includes two output signals, a normal output q and a scan output $S_{out}$. If scan is enabled, then the output from the flip-flop is passed to the scan output signal $S_{out}$.

Figure 4C:
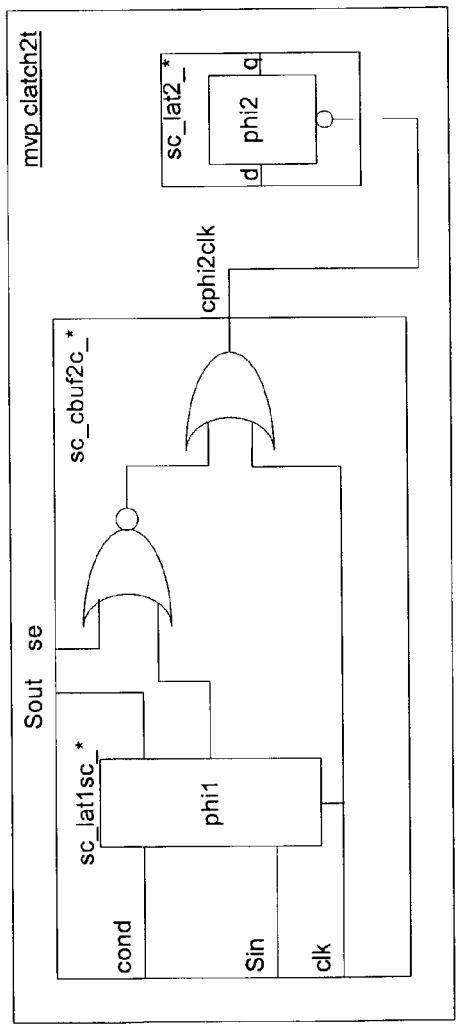
FIG. 4C is a block diagram of a latch with a scan-chain-controllable clock buffer.

Referring to FIG. 4C, latch mvp_clatch2t includes a latch sc_lat2_* as used in latch mvp_latch2 (as shown in FIG. 4A). In addition, latch mvp_clatch2t includes a clock buffer that is controllable through the scan chain when scan enable signal se is asserted. If scan enable signal se is not asserted, then the clock signal is simply buffered. Latch sc_lat1sc_* also propagates scan input signal $S_{in}$ to scan output signal $S_{out}$. The NOR gate, though not required, permits later use of the cell sc_cbuf2c_* in register mvp_cregister2t.

Figure 4D:
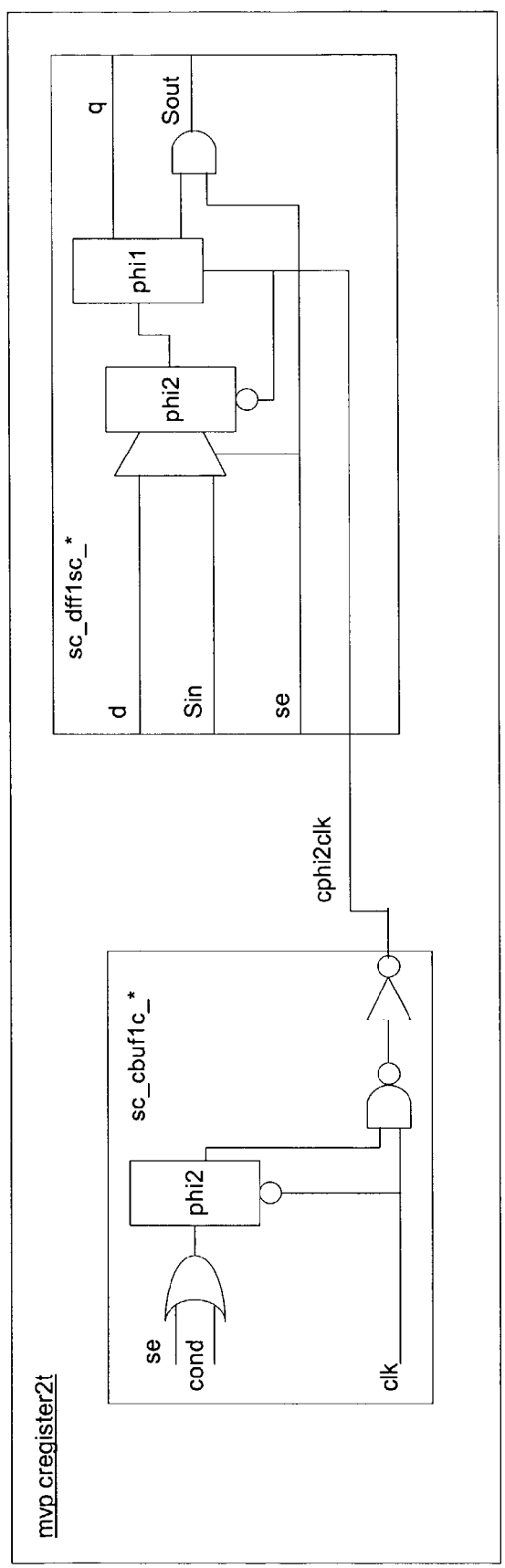
FIG. 4D is a block diagram of a register similar to that shown in FIG. 4B with a scan-chain-controllable clock buffer.

Referring to FIG. 4D, register mvp_cregister2t includes a clock buffer sc_cbuflc_* as used by latch mvp_clatch2t (as shown in FIG. 4C). In addition, the register includes a flip-flop sc_dff1sc_* as shown in FIG. 4B. The clock buffer propagates the scan signals and the clock signal to the flip-flop sc_dff1sc_*.

Referring to FIGS. 5A–5D, the cells described above with respect to FIGS. 4A–4D may be modified to incorporate a shadow latch as previously described. These cells allow the mux-based scan scheme described above to be incorporated into an integrated circuit.

Figure 5B:
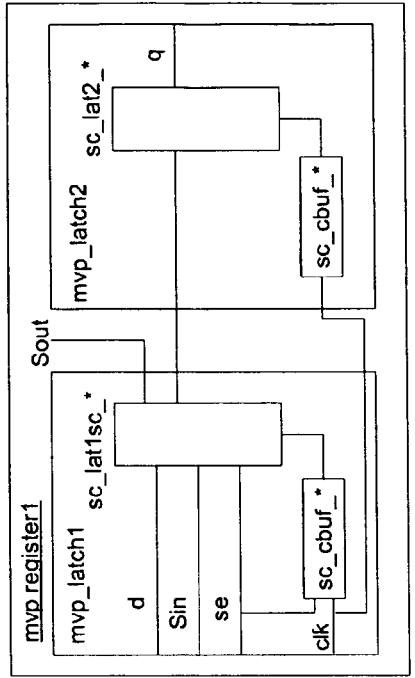
FIG. 5B is a block diagram of a register incorporating shadow latches.
Figure 5A:
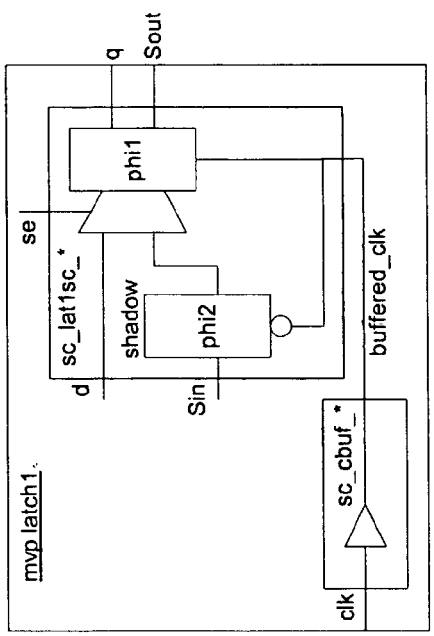
FIG. 5A is a block diagram of a shadow latch cell that may be used to incorporate design-for-test capability in an integrated circuit.

Referring to FIG. 5A, a flip-flop may be modified by moving a mux to the second latch within the flip-flop. This allows data inputs and outputs to be latched, while registering scan inputs and outputs. Thus, latch mvp_latch1 includes a clock buffer sc_cbuf_* as discussed above and a latch sc_lat1sc_* incorporating a shadow latch that receives the scan input signal $S_{in}$ and passes it to a mux associated with a second latch as shown. This design permits the circuit to operate normally with minimal delay, while providing a scan cell with a scan chain for testing.

Referring to FIG. 5B, register mvp_register1 includes two latches: mvp_latch1 and mvp_latch2 as described above. The scan output signal $S_{out}$ is registered by the first latch mvp_latch1 while the data signal is registered by latch mvp_latch2. Each latch includes a clock buffer sc_cbuf_* as described above.

Figure 5C:
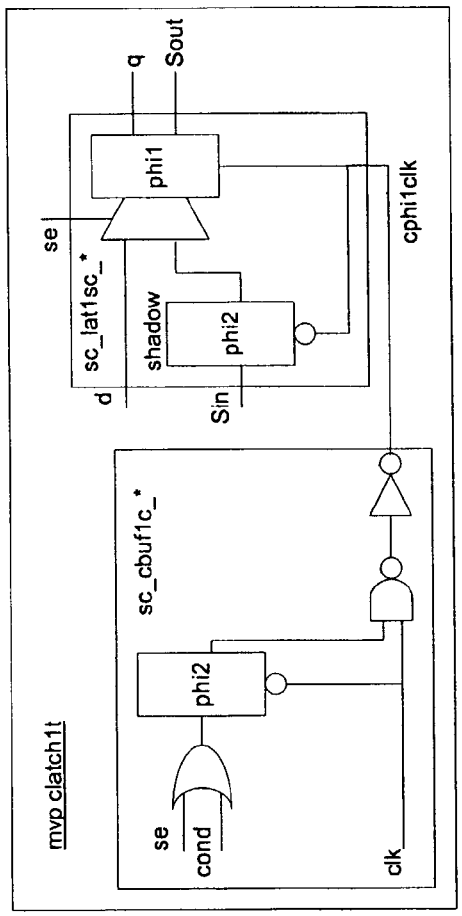
FIG. 5C is a block diagram of a shadow latch with a scan-chain-controllable clock buffer.

Referring to FIG. 5C, latch mvp_clatch1t includes a clock buffer sc_cbuf1c_* that may be controlled by the scan chain. The buffered clock output cphi1clk is passed to a shadow latch sc_lat1sc_* as shown in FIG. 5A.

Figure 5D:
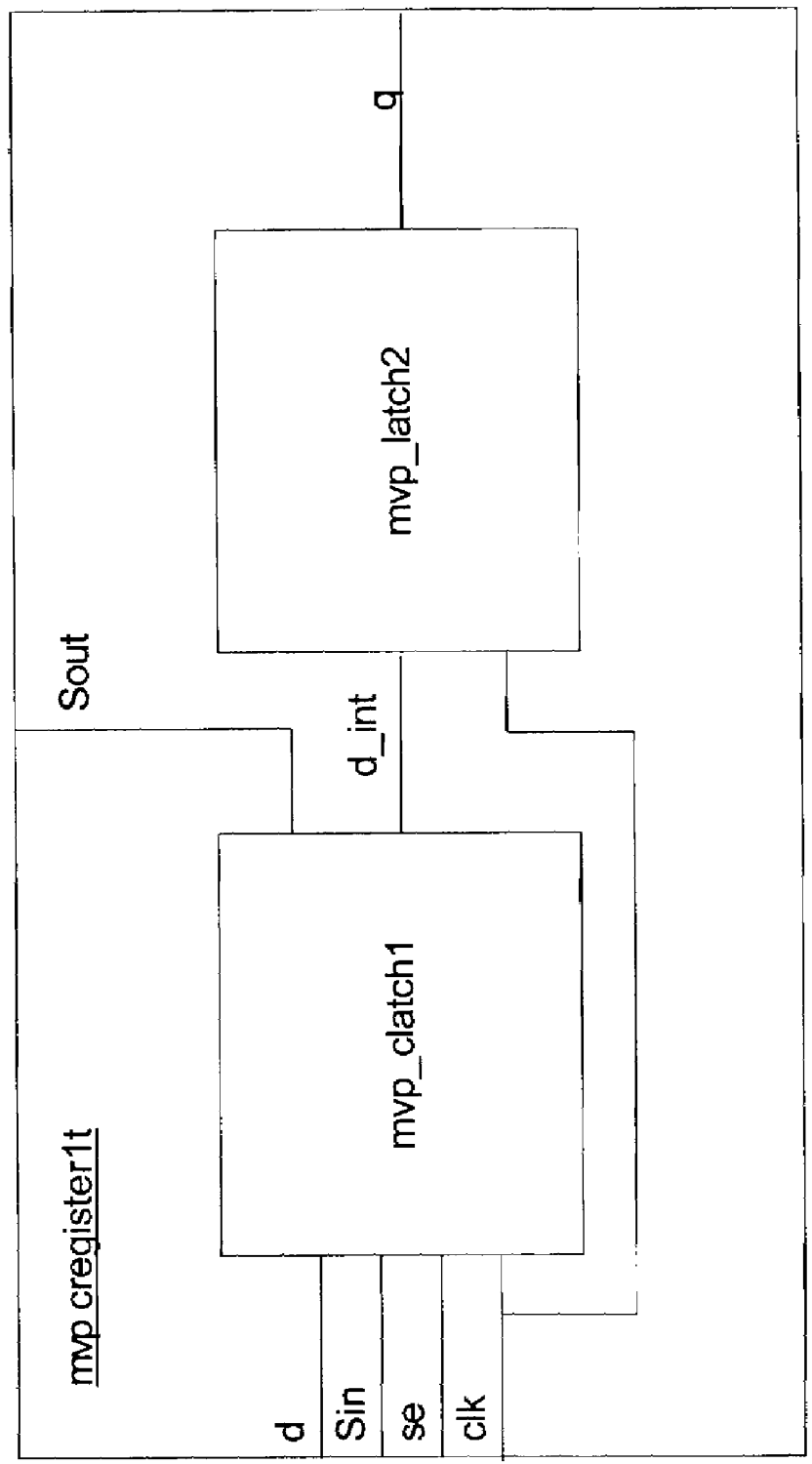
FIG. 5D is a block diagram of a register made from the latches shown in FIGS. 5C and 4A.

Referring to FIG. 5D, register mvp_cregister1t is a shadow latch based register made from mvp_clatch1 (as shown in FIG. 5C) and mvp_latch2 (as shown in FIG. 4A). These latches register the data input signal d, while allowing the clock signal to be controlled using the scan chain.

Figure 6:
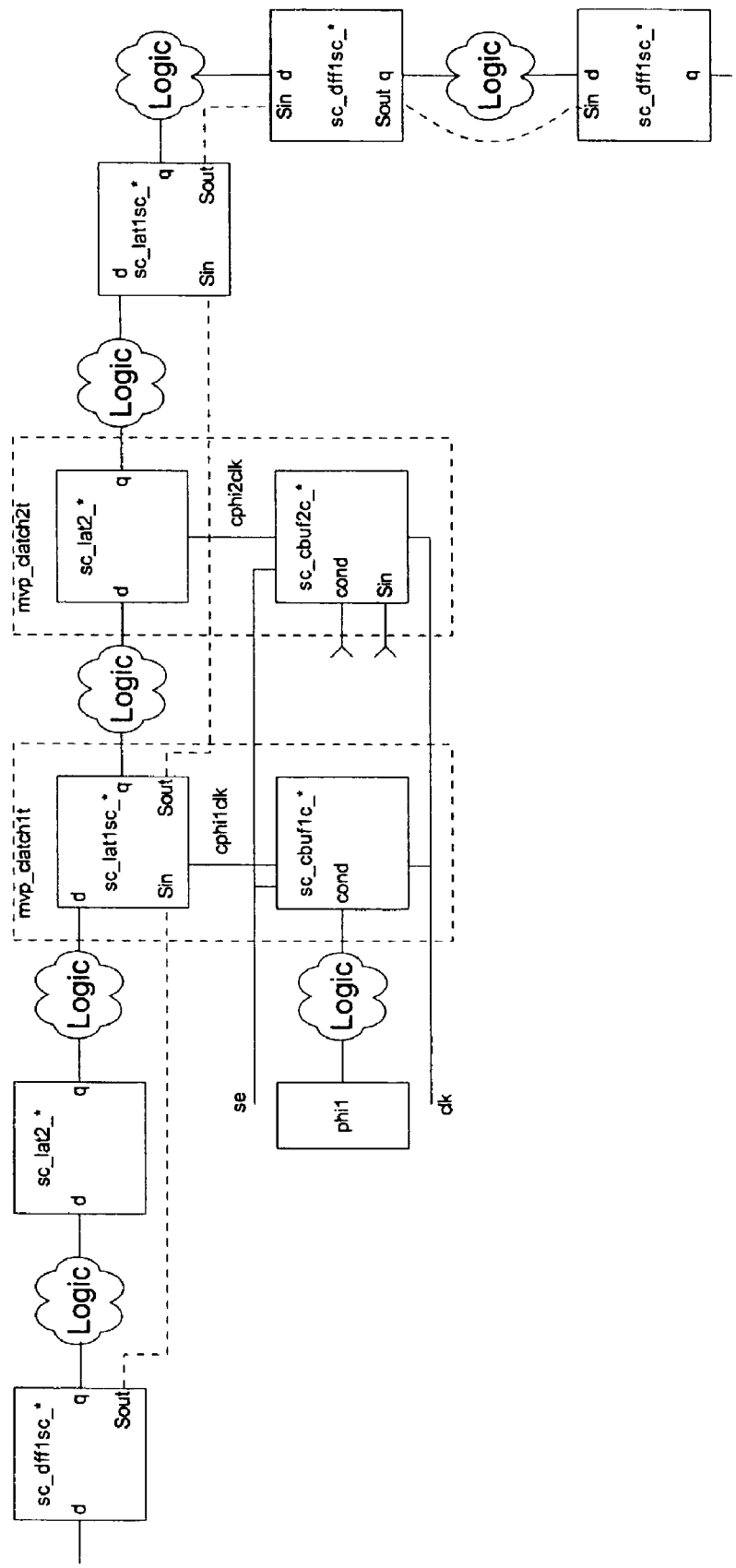
FIG. 6 is a block diagram of an integrated circuit incorporating shadow-latch-design-for-test functionality using the cells described in FIGS. 4A–4D and FIGS. 5A–5D.

Referring to FIG. 6, the cells described above may be used to implement a mux-based scan scheme. FIG. 6 illustrates the use of the cells to implement a scan chain through a series of logic gates. In this example, the first cell in the circuit is a flip-flip sc_dff1sc_*. The scan signals from the flip-flop bypass a master latch, implemented using cell sc_lat2_* to a shadow latch, implemented using cell sc_lat1sc_*. The shadow latch approach is repeated, again using cell sc_lat2_* as a master latch and cell sc_lat1sc_* as the shadow latch. Finally, the scan chain ends with a series of two flip-flops implemented using cell sc_dff1sc_*. The clock signals for the first slave latch sc_lat1sc_* and the second master latch sc_lat2_* are buffered using clock buffers sc_cbuf1c_* and sc_cbuf2c_*. As would be understood by those having ordinary skill in the art, only those signals useful to illustrate this embodiment are shown in FIG. 6. Reference is made to FIGS. 4C (sc_lat2_*, sc_cbuf2c_*, and mvp_clatch2t), 4D (sc_dff1sc_*) and 5C (sc_lat1sc_*, sc_cbuF1c_* and mvp_clatch1t) for more detailed figures of each block showing input signals data (d), scan input ($S_{in}$), clock (clk), scan enable (se) and condition (cond), and output signals data output (q), scan ouput (Sout) and buffer output (cphi1clk and cphi2clk). The cond signal, if asserted, allows the allows the clock buffer to generate a clock to the sequential cell to clock in new data. If the cond signal is deasserted, the clock to the sequential cell is held inactive, holding the data from the previous cycle.

Figure 7A:
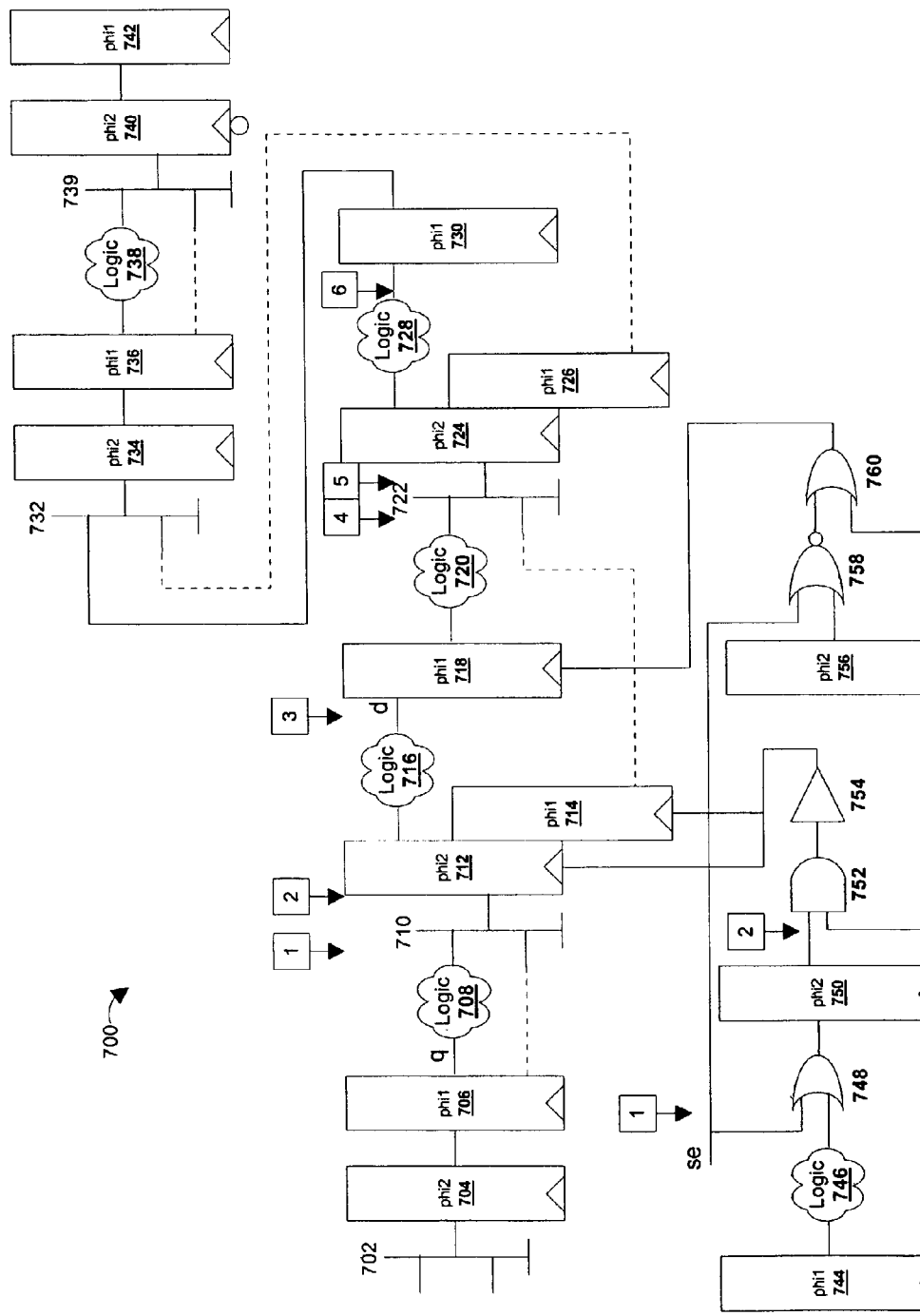
FIG. 7A is a block diagram of an integrated circuit incorporating a flipped version of the shadow latch design-for-test functionality.

Referring to FIG. 7A, the shadow latch may be phi2-sensitive as discussed above, or phi1-sensitive as shown in circuit 700. Mux 702 receives two signals and passes one, based on a control signal to phi2 latch 704. The output of phi2 latch 704 is connected to the input of phi1 latch 706 and the output of phi1 latch 706 is passed to logic block 708. Additionally, a scan output from phi1 latch 706 is passed to mux 710. Mux 710 selects between the output of logic block 708 and the scan output signal from phi1 latch 706 and passes a signal to phi2 latch 712, which is coupled to a phi1 latch 714. The output of phi2 latch 712 is connected to logic block 716, which is in turn connected to phi1 latch 718.

Phi1 latch 714 is a shadow latch corresponding to phi1 latch 718 which is the master latch. The output of phi1 latch 718 is coupled to logic block 720 which in turn is connected to mux 722. Mux 722 selects between the scan signal from phi1 latch 714 and the data signal from logic 720 and sends the result to phi2 latch 724, which serves as the slave latch. In this example, the shadow latch scheme is repeated with phi1 latch 726 serving as a shadow latch around logic block 728 and phi1 latch 730 (the master latch). The outputs are connected to mux 732. Phi2 latch 734 and phi1 latch 736 form a flip-flop to register the output, passing the result to logic block 738. Finally, mux 739, phi2 latch 740, and phi1 latch 742 form a second muxed flip-flop.

The clock signals for the phi2 latch 712, phi1 latch 714, and the phi1 latch 718 are generated using clock buffers as shown. A phi1 latch 744 connects to logic block 746 and then to an OR gate 748. Gate 748 computes the logical-or of the se signal and the output from logic 746 and passes the result to phi2 latch 750. Gate 752 computes the logical-and of the phi2 latch 750 output and the clock signal clk and passes the result to buffer 754. The resulting signal is used as the clock input for phi2 latch 712 and phi1 latch 714.

Additionally, the output of phi2 latch 756 is connected to NOR gate 758. Gate 758 computes the logic-nor of the se signal and the output of phi2 latch 756. Gate 760 computes the logical-or of the output of gate 758 and the clock signal clk. The resulting signal is used as the clock input to phi1 latch 718.

Figure 7B:
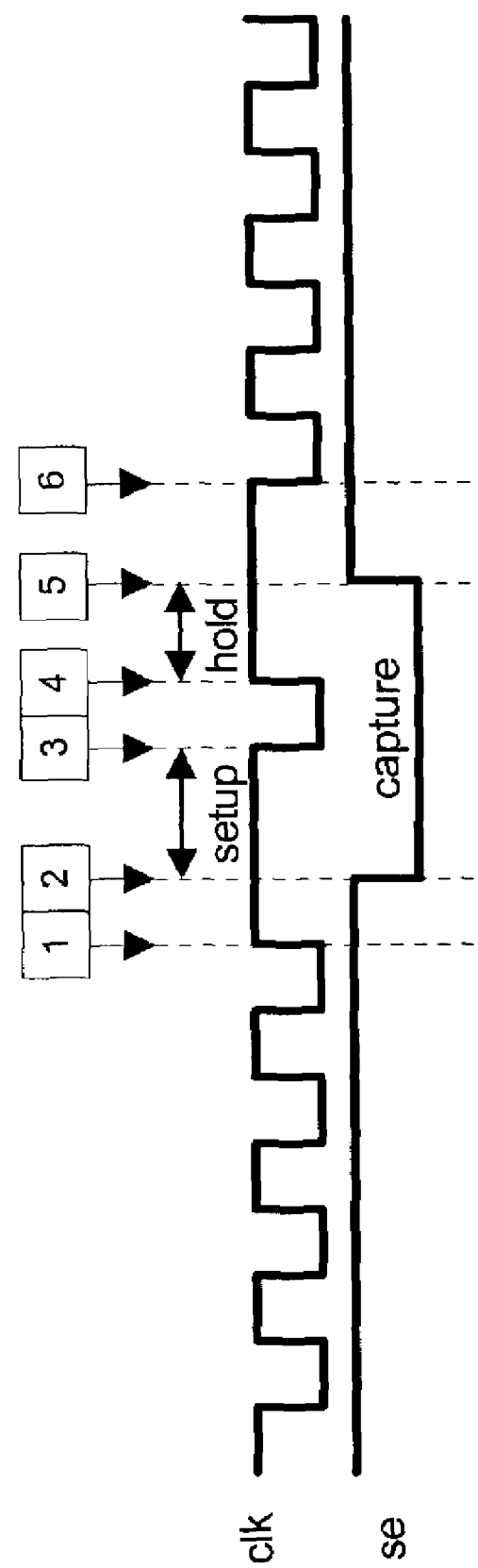
FIG. 7B is a is a timing diagram of a circuit such as that shown in FIG. 7A incorporating a flipped version of the shadow latch design-for-test functionality.

FIG. 7B illustrates the timing of the circuit shown in FIG. 7A. Because gates have been changed from phi1-sensitive to phi2-sensitive and vice versa, the timing changes slightly from that described above with respect to FIG. 3B.

An integrated circuit incorporating design-for-test functionality using the shadow latches as discussed above may be tested using conventional testing methods. Input vectors may be applied to various scan cells through the chain and the results of those input vectors may be observed to verify functionality of the circuit. A test device may generate test vectors or use a predetermined set of test vectors, apply the test vectors to a circuit under test, and receive outputs. The outputs may then be compared with the expected outputs to verify operability and functionality of the circuit. One skilled in the art will understand that a scan chain scheme implemented using the techniques described appears functionality identical to conventional scan chain schemes from the perspective of the testing device. Thus, any known testing devices and techniques may be used to test the functionality and operability of a circuit.

In addition to mux-based full scan schemes using hardware (e.g., within a microprocessor or microcontroller), implementations also may be embodied in software disposed, for example, in a computer usable (e.g., readable) medium configured to store the software (i.e., computer readable program code or data). The software enables the functions, fabrication, modeling, simulation, and/or testing of the systems and techniques disclosed herein. For example, this can be accomplished through the use of general programming languages (e.g., C, C++), GDSII, hardware description languages (HDL) including Verilog HDL, VHDL, AHDL (Altera HDL) and so on, or other available databases, programming and/or circuit (i.e., schematic) capture tools. The software can be disposed in any known computer usable medium including semiconductor, magnetic disk, optical disk (e.g., CD-ROM, DVD-ROM) and as a computer data signal embodied in a computer usable (e.g., readable) transmission medium (e.g., carrier wave or any other medium including digital, optical, or analog-based medium). As such, the software can be transmitted over communication networks including the Internet and intranets.

A number of implementations have been described. Nevertheless, it will be understood that various modifications may be made without departing from the spirit and scope of the invention. Accordingly, other implementations are within the scope of the following claims.

What is claimed is:

1. An apparatus, comprising:
   a chain of components responsive to a first clock; and
   a scan cell positioned in the chain, the scan cell including:
      a master latch to process data signals in response to a second clock,
      a shadow latch to process a scan signal in response to the second clock,
      a multiplexer to selectively route output from the master latch and the shadow latch to produce multiplexer output, and
      a slave latch to process the multiplexer output in response to the first clock.

2. The apparatus of claim 1 wherein the master latch processes data signals from the chain.

3. The apparatus of claim 1 wherein the shadow latch processes scan signals from the chain.

4. The apparatus of claim 1 wherein the chain includes sequential flip-flops.

5. The apparatus of claim 1 wherein the chain includes combinatorial logic.

6. The apparatus of claim 1 wherein the chain includes dynamic logic.

7. The apparatus of claim 1 wherein the scan cell is operative in a first mode for testing and a second mode for normal operation.

8. The apparatus of claim 7 wherein the first mode is selected with the scan signal.

9. The apparatus of claim 1 wherein the second clock is a buffered version of the first clock.

10. The apparatus of claim 1 wherein the master latch and the shadow latch are transparent on different phases of the second clock.

11. A computer readable medium, comprising executable instructions to:
    establish a chain of components responsive to a first clock; and
    specify a scan cell positioned in the chain, the scan cell including:
       a master latch to process data signals in response to a second clock,
       a shadow latch to process a scan signal in response to the second clock,
       a multiplexer to selectively route output from the master latch and the shadow latch to produce multiplexer output, and
       a slave latch to process the multiplexer output in response to the first clock.

12. The computer readable medium of claim 11 wherein the executable instructions to specify a scan cell include executable instructions to specify a master latch to process data signals from the chain.

13. The computer readable medium of claim 11 wherein the executable instructions to specify a scan cell include executable instructions to specify a shadow latch to process scan signals from the chain.

14. The computer readable medium of claim 11 wherein the executable instructions to establish a chain of components include executable instructions to establish sequential flip-flops.

15. The computer readable medium of claim 11 wherein the executable instructions to establish a chain of components include executable instructions to establish combinatorial logic.

16. The computer readable medium of claim 11 wherein the executable instructions to establish a chain of components include executable instructions to establish dynamic logic.

17. The computer readable medium of claim 11 wherein the executable instructions to specify a scan cell include executable instructions to specify a scan cell operative in a first mode for testing and a second mode for normal operation.

18. The computer readable medium of claim 17 wherein the first mode is selected with the scan signal.

19. The computer readable medium of claim 11 wherein the executable instructions to specify a scan cell include executable instructions to specify the second clock as a buffered version of the first clock.

20. The computer readable medium of claim 11 wherein the executable instructions to specify a scan cell include executable instructions to specify the master latch and the shadow latch as transparent on different phases of the second clock.

* * * * *